United States Patent [19]

Fukuda

[11] Patent Number: 4,962,350

[45] Date of Patent: Oct. 9, 1990

[54] LOAD CONDITION DETECTING AND DRIVING SYSTEM

[75] Inventor: Kazuaki Fukuda, Furukawa, Japan

[73] Assignee: Alps Electric Co., Ltd., Tokyo, Japan

[21] Appl. No.: 398,817

[22] Filed: Aug. 25, 1989

[30] Foreign Application Priority Data

Aug. 30, 1988 [JP] Japan .......................... 63-112732[U]

[51] Int. Cl.$^5$ .......................................... H02M 3/335
[52] U.S. Cl. ..................... 323/283; 323/284;
323/285; 323/351; 340/652; 340/661; 361/18;
361/79; 361/90
[58] Field of Search ............... 323/282, 283, 284, 285,
323/349, 351; 340/641, 652, 660, 661, 662, 663,
664; 361/18, 79, 86, 87, 88, 90, 91, 92, 93

[56] References Cited

U.S. PATENT DOCUMENTS

| | | | |
|---|---|---|---|
| 3,588,612 | 6/1971 | Leathem et al. | 361/79 |
| 3,629,622 | 12/1971 | Dewenberg, Jr. | 323/284 |
| 3,988,661 | 10/1976 | McCoy | 323/282 |
| 4,127,885 | 11/1978 | Adam et al. | 323/285 |
| 4,438,498 | 3/1984 | Sekel et al. | 323/283 |
| 4,521,725 | 6/1985 | Phaneuf | 323/285 |
| 4,574,276 | 3/1986 | Sato | 340/661 |

*Primary Examiner*—Peter S. Wong
*Attorney, Agent, or Firm*—Guy W. Shoup; Paul J. Winters

[57] ABSTRACT

A load condition detecting a control system for supplying a load current to a load from a power source wherein, when said load exhibits a short circuit condition, a driving signal controlling the application of high current to the load is immediately pulled down, shutting-off the flow of high current to the load. Thus, even before a short circuit condition is detected by any logic means, the high current is disconnected from the load, preventing any possible damage to the load or other circuitry. The system also detects an open circuit load condition. Upon detection of either an open or a short circuit load condition, the system then blocks the driving signal from being applied to the driving circuitry until the system is reset.

6 Claims, 6 Drawing Sheets

LOAD CONDITION DETECTING AND DRIVING SYSTEM

FIELD OF THE INVENTION

The present invention relates to a load condition detecting and driving system, and in particular to a load condition detecting and driving system for controlling load current to a load in response to a determination of a normal or abnormal condition of the load.

BACKGROUND OF THE INVENTION

Figure 5:
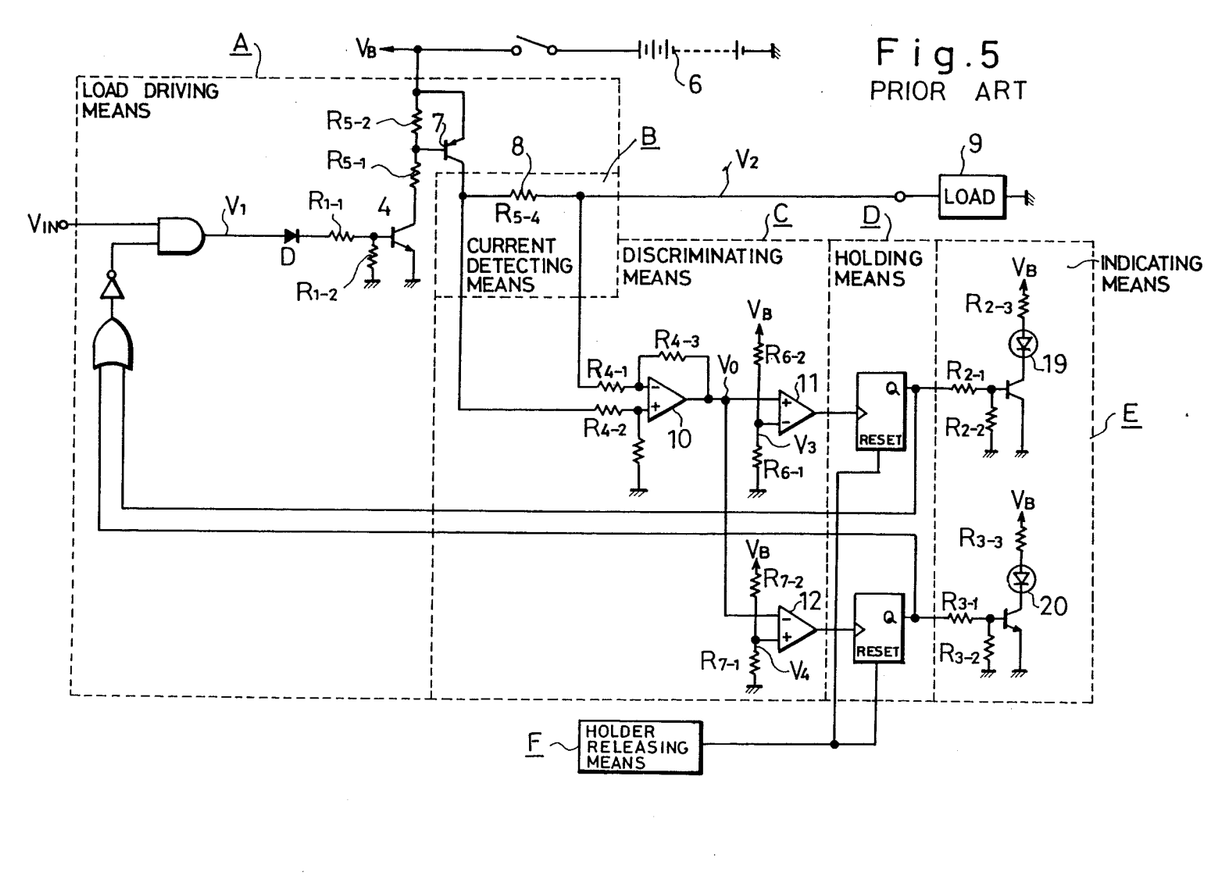
FIGS. 5 and 6 are, respectively, the circuit diagram and block diagram of a previously proposed system.
Figure 6:
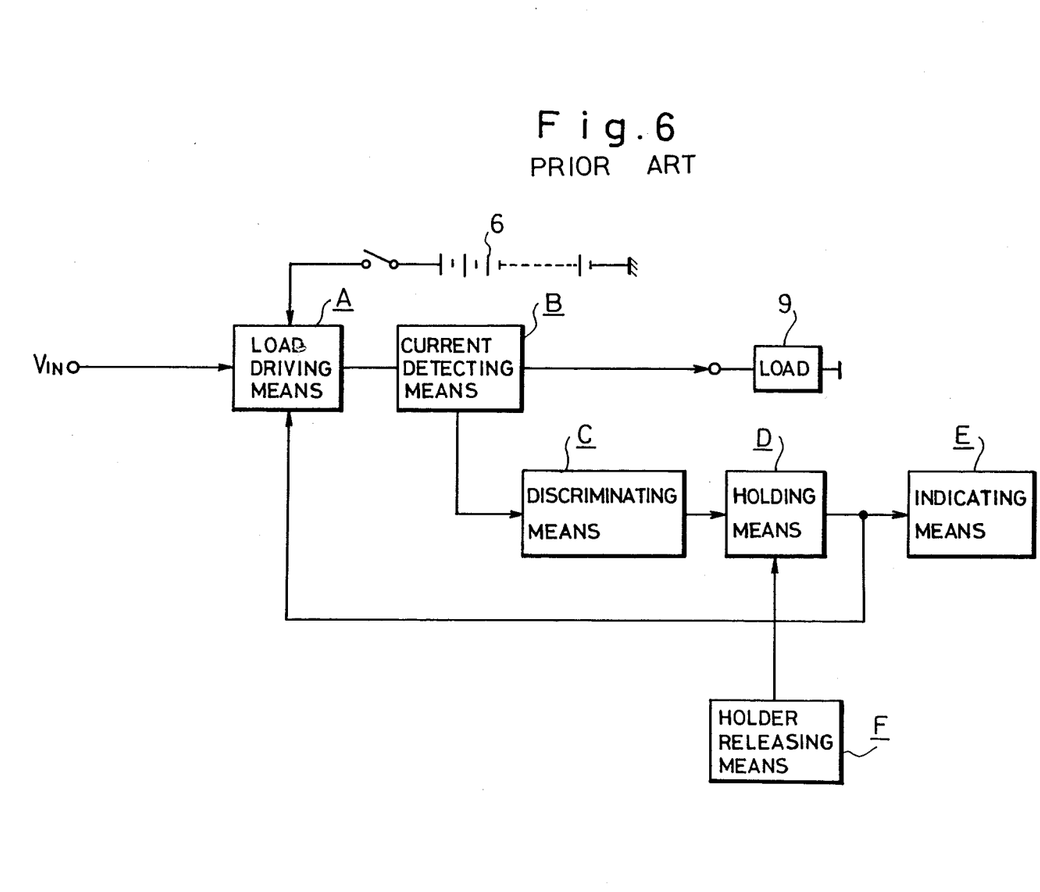

A system for controlling a load current to a load, wherein the load current is based on the automatic detection of a normal or abnormal load condition, has been heretofore known. FIGS. 5 and 6 are, respectively, a circuit diagram and a block diagram showing the configuration of a system of this kind, which has been proposed by an Applicant of this invention in U.S. patent application No. 07/282,416.

The load condition detecting and driving system of FIGS. 5 and 6 is comprised of a load driving means A, a current detecting means B, a discriminating means C, a holding means D, an indicating means E, and a holder releasing means F. The voltage of a battery 6 is applied to the load driving means A, and current is supplied to load 9 through current detecting means B, connected between the load driving means A and the load 9.

As shown in FIG. 5, the load driving means A includes transistors 4 and 7, constituting a switch circuit. When driving signal $V_{IN}$ is applied to load driving means A, transistors 4 and 7 are rendered conductive, and the load current flows from battery 6 through transistor 7 and through current detecting resistor 8 of the current detecting means B to load 9.

As current flows to load 9, since both ends of the current detecting resistor 8 are respectively connected to the input terminals of differential amplifier 10 of the discriminating means C, a voltage $V_O$ corresponding to the load current flowing through the current detecting resistor 8 is obtained at the output terminal of differential amplifier 10.

This voltage $V_O$ is compared with a threshold voltage $V_3$, which is set by dividing the voltage $V_B$ supplied from battery 6 using series resistors $R_{6-1}$ and $R_{6-2}$, by means of differential amplifier 11. Similarly, voltage $V_O$ is also compared with another threshold voltage $V_4$, which is set by dividing the voltage $V_B$ using series resistors $R_{7-1}$ and $R_{7-2}$, by means of another differential amplifier 12.

Figure 7:
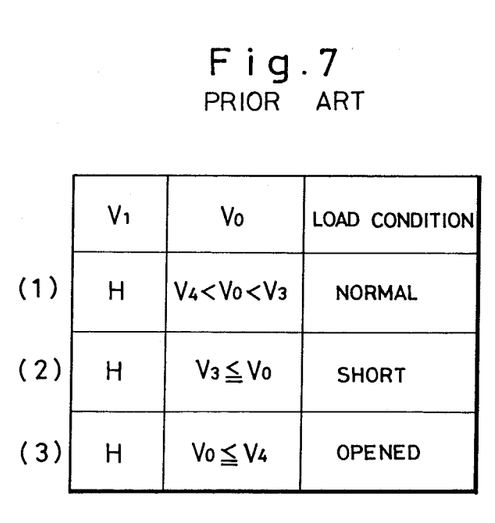
FIGS. 7 and 8 are, respectively, a table and graph illustrating the operation of the previously proposed system of FIGS. 5 and 6.
Figure 8:
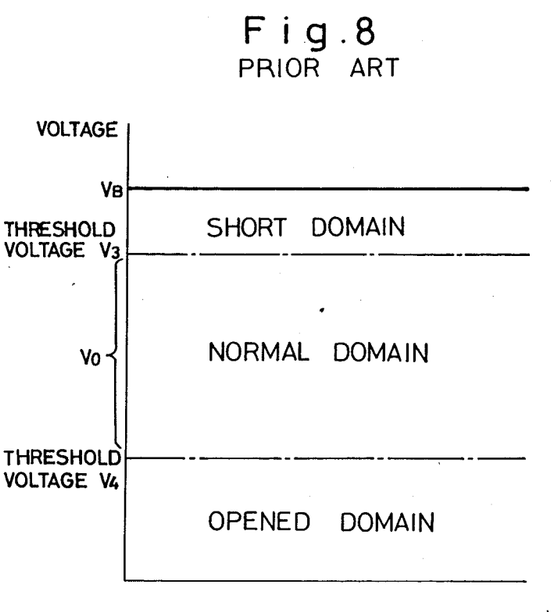

When the load 9 is in an abnormal short circuit condition, the load current is greatly increased, and the voltage $V_O$ outputted from differential amplifier 10 becomes larger so that $V_O$ exceeds $V_3$, as shown in FIGS. 7(2) and 8. Thereafter, the resulting HIGH output signal of amplifier 11 is applied to the input of holding means D, which latches this state and energizes indicating means E, causing light emitting diode (LED) 19 to illuminate and indicate a short circuit abnormal condition.

When the load is in an abnormal open circuit condition, drawing essentially no load current, the voltage $V_O$ outputted by differential amplifier 10 will be very low so that $V_O$ is less than $V_4$, as shown in FIGS. 7(3) and 8. Thereafter, the resulting HIGH output signal of differential amplifier 12 is applied to the input of the holding means D, which latches this state and energizes indicating means E, causing another light in the LED 20 to illuminate and indicate an open circuit abnormal condition.

In either the case of the short circuit condition or the open circuit condition of the load, the application of the driving signal $V_{IN}$ to the load driving means A is interrupted by the use of logic means and the HIGH output signal from the holding means D. Consequently, the system is placed in a non-driving state, and the abnormal load condition is identified.

When the load is in a normal condition, voltage $V_O$ is between $V_3$ and $V_4$, and normal operating current is supplied to the load.

In the above-described system, even when the load is in an acceptable condition, the load condition may vary significantly from a normal condition. Hence, the load current is also changed in response thereto, causing the voltage $V_2$ to change. If the load condition varies sufficiently, despite that it is not either in the open circuit condition or the short circuit condition, the circuit of FIGS. 5 and 6 may misjudge the load to be in an abnormal condition and undesirably discontinue current to the load.

Further, since the divided voltage $V_B$ from battery 6 forms the threshold voltages $V_3$ and $V_4$, when the voltage $V_B$ of battery 6 drops for any reason, the threshold voltages $V_3$ and $V_4$ are changed, and the discriminating standard is changed. Therefore, an accurate discrimination between a normal operation condition and an abnormal operating condition becomes impossible.

Moreover, if the load 9 is in a short circuit condition, a predetermined amount of time is required for the discriminating means C to discriminate this abnormal condition and cause the signal from the holding means D to interrupt the input of the driving signal $V_{IN}$ to the load driving means A and turn off transistors 4 and 7. Thus, the switching off of transistors 4 and 7 is not instantaneous after load 9 is in a short circuit condition. As a result, the high current supplied to the short circuited load for this predetermined amount of time can possibly cause damage to the short circuited load or other circuits. In addition, using the system of FIGS. 5 and 6 makes it difficult to determine the condition of the load if a driving signal $V_{IN}$ is not already applied to the load driving means A.

SUMMARY OF THE INVENTION

The present invention solves such disadvantages as described above. Objects of the present invention are to provide a load condition detecting and driving system which is capable of detecting an abnormal condition of the load stably and with high accuracy without being affected by any acceptable variation of the load or change in the voltage supplied by a power source. Additional objects of the present invention are to determine the specific abnormal condition of a load without requiring the inputting of a driving signal and to instantaneously interrupt the load current to the load in the event the load is in a short circuit condition.

In order to attain these aforementioned objects, the present inventive load condition detecting and control system first supplies load current to a load from a power source device. If either a short circuit condition or an open circuit condition of a load is detected by a condition discriminating means discriminating the load condition, then either a short circuit detection signal or an open circuit detection signal representing said condition is outputted from said condition discriminating means, and the input of the driving signal into the load driving means is interrupted. In this inventive circuit, when a short circuit condition is detected, the driving signal controlling the high current applied to the load is immediately pulled down, shutting off the flow of high current to the load. Further, the circuitry of the present invention enables the power supply voltage to vary without affecting the operation of the circuit.

According to one aspect of the present invention, a first resistor is provided between a load and a power supply for supplying power to the load, where the value of the first resistor is set higher than the nominal load resistance. Thus, by coupling power supply voltage to the first resistor, a low current is allowed to flow to the load through the first resistor. In parallel with this first resistor is connected a driver transistor whose conduction is controlled by a driving signal. Thus, when the driving signal is high and the transistor is conducting, a high power may be supplied to the load.

Before application of a driving signal to the transistor, if a power supply voltage is applied to the first resistor and a voltage at an input terminal of the load is detected by a logic means to be over a predetermined value, a decision that the load is in an open circuit is made and this condition is indicated by the illumination of an LED. Any driving signal is then automatically blocked from being applied to the control terminal of the transistor.

If the load is in a short circuit condition after application of a driving signal to the driver transistor, the voltage at the input terminal of the load will be low due to the load being essentially short circuited to ground. In this inventive circuit, the input driving signal is also coupled to the input terminal of the load through a diode such that this low voltage at the input terminal of the load immediately pulls any driving signal to approximately 0.7 volts. An additional diode further drops the voltage applied to the base of a switching transistor to zero, rendering the driver transistor non-conductive so as to prevent high current from being supplied to the load. Thus, even before a short circuit condition is detected by any logic means, the high current is disconnected from the load, preventing any possible damage to the load or other circuitry. Subsequently, a logic means totally decouples the driving signal from the load driving circuit.

During driving of the load, when the load is drawing a normal operating current, the voltage at the input terminal of the load is at a high voltage, and the driving voltage is also at a high level. The high levels of the states do not cause any disconnection of the driving signal to the driver transistor and normal operation is continued.

Further, according to the preferred embodiment of the present invention, when it is determined that the load is either in a short circuit condition or an open circuit condition by a discrimination circuit, these conditions are indicated by means of an illuminated LED.

DETAILED DESCRIPTION OF THE INVENTION

The present invention will be explained in detail with respect to the preferred embodiment and the accompanying drawings.

Figure 1:
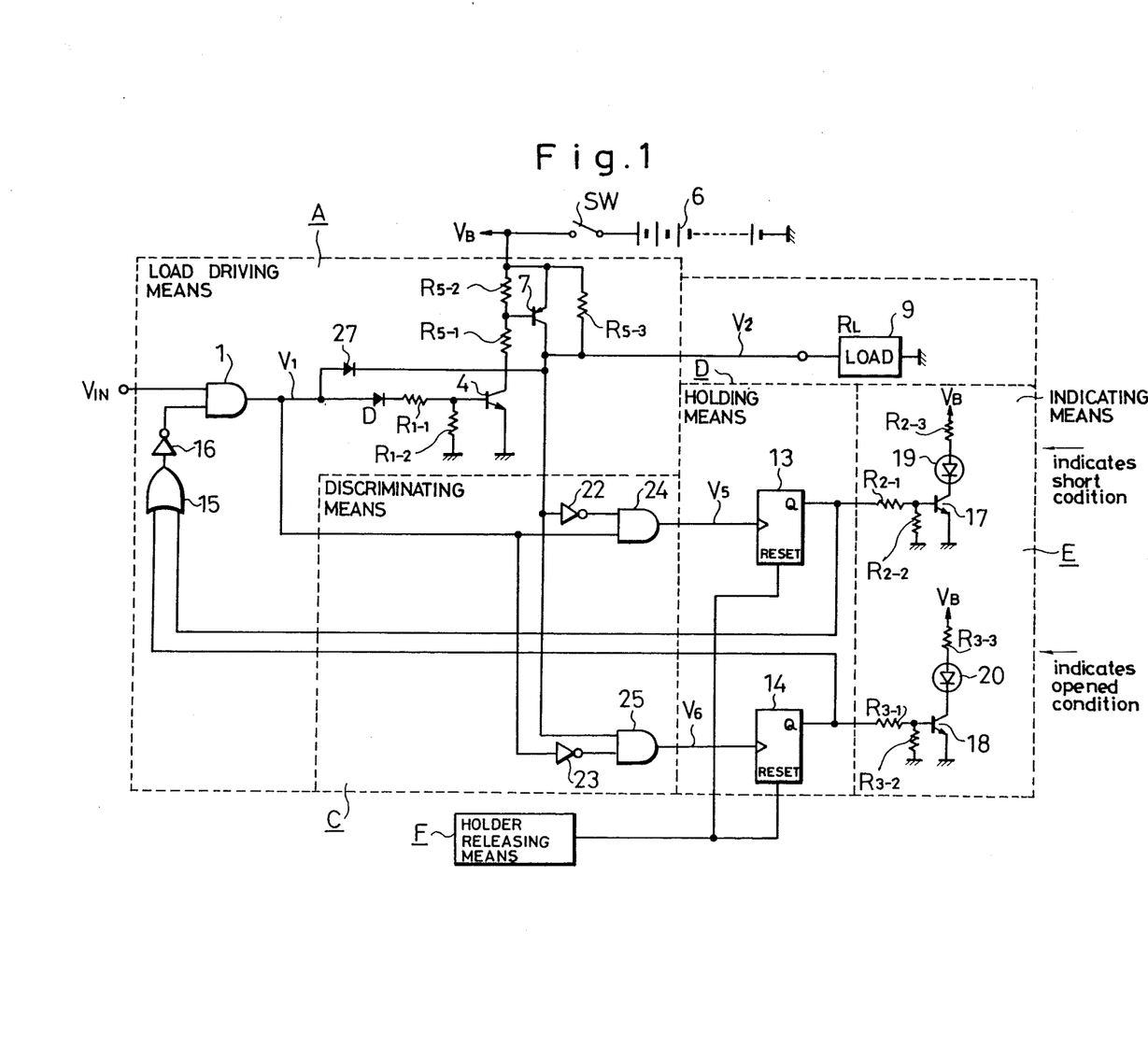
FIG. 1 is a circuit diagram of a preferred embodiment of the present invention.
Figure 2:
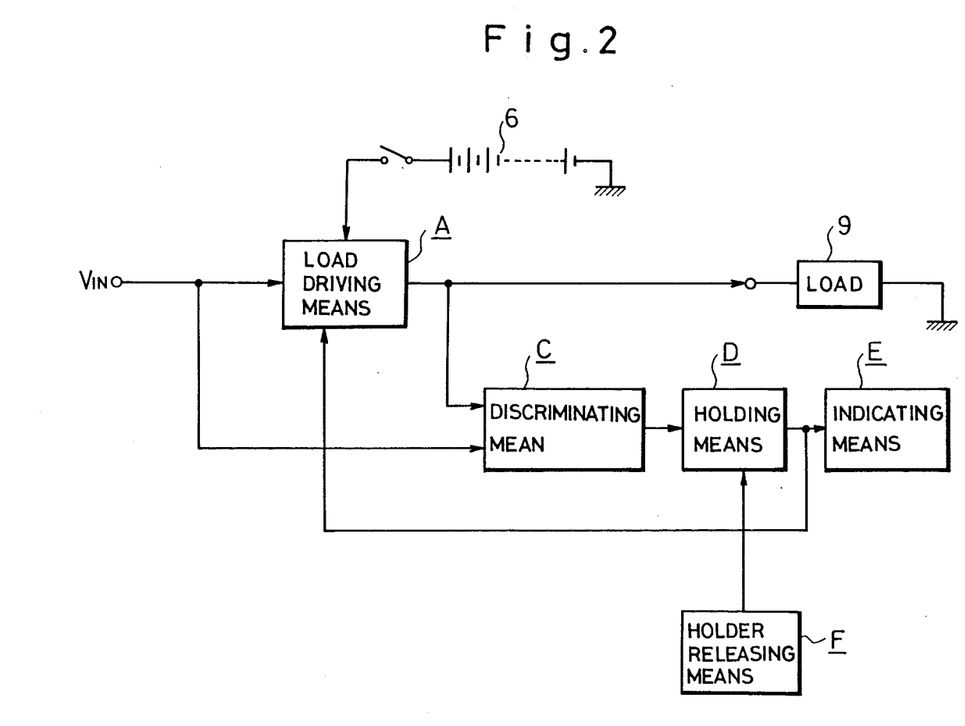
FIG. 2 diagram of the preferred embodiment of the present invention.

FIG. 1 is a circuit diagram showing the configuration of the preferred embodiment of the invention, and FIG. 2 is a representative block diagram of the invention. The system of FIG. 2 comprises a load driving means A, a deciding or discriminating means C, a holding means D, an indicating E, and a holder releasing means F. A voltage $V_B$, provided by a battery 6, is supplied to the load driving means A, which, in turn, supplies power to load 9.

In FIG. 1, numerals 1, 24 and 25 designate AND circuits, numerals 4, 7, 17 and 18 designate transistors, numeral 6 designates a battery, numeral 9 designates a load, numerals 13 and 14 designate latch circuits, numeral 15 designates an OR circuit, numerals 19 and 20 designate light emitting diodes, numerals 16, 22, and 23 designate inverter circuits, and numeral 27 designates a diode.

Load driving means A is provided with AND circuit 1. An output terminal of AND circuit 1 is connected by way of diode D and resistors $R_{1-1}$ and $R_{1-2}$, configured as a voltage divider, to a base of transistor 4. An emitter of transistor 4 is grounded. The voltage $V_B$ of battery 6 is applied through series resistors $R_{5-1}$ and $R_{5-2}$ to a collector of transistor 4.

To a base of transistor 7 is applied a voltage resulting from voltage $V_B$ of battery 6 being divided by resistors $R_{5-1}$ and $R_{5-2}$. Resistor $R_{5-3}$ is connected between the emitter and collector of transistor 7. Load 9, having a nominal load resistance $R_L$, is connected between the collector of transistor 7 and ground, where the value of resistor $R_{5-3}$ is made greater than the value of load resistance $R_L$. An anode of diode 27 is connected to the output terminal of AND circuit 1, and the cathode of diode 27 is connected to the collector of transistor 7.

Inverter circuits 22 and 23 and AND circuits 24 and 25 are provided in discriminating circuit C, in which the collector of transistor 7 is connected to a first input terminal of AND circuit 24 through inverter circuit 22 and also connected to a first input terminal of AND circuit 25. The output terminal of AND circuit 1 (i.e., voltage $V_1$) is connected to a second input terminal of AND circuit 24 and also connected to a second input terminal of AND circuit 25 through inverter circuit 23.

Latch circuits 13 and 14 are provided in holding means D, in which an output terminal of AND circuit 24 is connected to the input terminal of latch circuit 13, and an output terminal of AND circuit 25 is connected to the input terminal of latch circuit 14. Moreover, the output terminals of these latch circuits 13 and 14 are connected to respective input terminals of OR circuit 15 provided in load driving means A. The output terminal of OR circuit 15 is connected to a first input terminal of AND circuit 1 through inverter circuit 16, while driving signal $V_{IN}$ is connected to a second input terminal of AND circuit 1.

Indicator means E is provided with transistor 17 and 18 and light emitting diodes 19 and 20, in which an output terminal of latch circuit 13 is connected to a base of transistor 17 through resistor $R_{2-1}$, where resistors $R_{2-1}$ and $R_{2-2}$ act as a voltage divider network. An emitter of transistor 17 is grounded. A cathode of light emitting diode 19 is connected to a collector of transistor 17, and voltage $V_B$ of battery 6 is applied to an anode of light emitting diode 19 through resistor $R_{2-3}$.

Similarly, an output of latch circuit 14 is connected to a base of transistor 18 through a resistor $R_{3-1}$, where resistors $R_{3-1}$ and $R_{3-2}$ act as a voltage divider network. An emitter of transistor 18 is grounded. A cathode of light emitting diode 20 is connected to a collector of transistor 18, and voltage $V_B$ of battery 6 is applied to an anode of light emitting diode 20 through resistor $R_{3-3}$.

In addition, holder releasing circuit F is connected to the reset terminals of latch circuits 13 and 14.

The operation of the preferred embodiment of the invention constituted as described above will now be explained.

Open Circuit Load Condition

When the load is in an open circuit condition, even though switch SW coupled in series with battery 6 is closed, a current does not flow through resistor $R_{5-3}$ since the load acts as an open circuit, and a logic value of the voltage $V_2$ at the input terminal of load 9 is HIGH.

Since, as previously mentioned, the value of resistor $R_{5-3}$ is set greater than the load resistance $R_L$, the logic value of the voltage $V_2$ at the input terminal of load 9 when load 9 is not in an open circuit condition is LOW when switch SW is closed, due to the relatively high voltage drop across resistor $R_{5-3}$ as compared to the voltage drop across load resistance $R_L$. Therefore, the logic value of the voltage $V_2$ clearly discriminates a normal operating condition of the load from an abnormal operating condition of the load when load 9 is in an open circuit condition.

Figure 3:
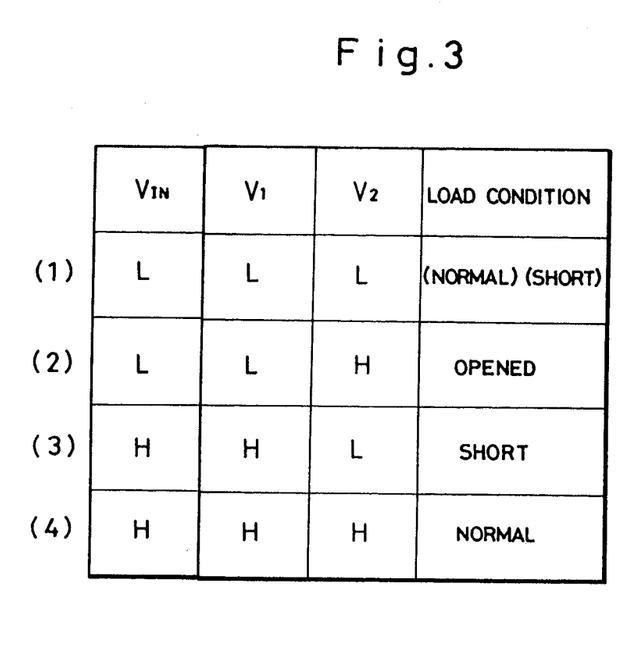
FIGS. 3 and 4 are, respectively, an explanatory table and graph illustrating the operation of the preferred embodiment of the present invention.

Thus, when switch SW is first closed prior to a driving signal $V_{IN}$ being applied to load driving means A, an open circuit load condition causes a HIGH voltage $V_2$ to be applied to the first input terminal of AND circuit 25 and a LOW voltage $V_1$ signal to be applied to inverter circuit 23 coupled to the second input terminal of AND circuit 25. Consequently, the logic value of the output voltage $V_6$ of AND circuit 25 becomes HIGH. This HIGH logic value is applied to the input terminal of latch circuit 14 whose output becomes HIGH. This HIGH output signal at the output terminal of latch 14 causes transistor 18 to conduct, and light emitting diode 20 is illuminated to indicate the load is in open circuit condition. At the same time, the HIGH signal at the output terminal of latch circuit 14 is applied to OR circuit 15, whose output is inverted by inverter circuit 16 and applied to one input of AND circuit 1. Thus, any subsequent application of driving signal $V_{IN}$ to the input of AND circuit 1 will be interrupted by AND circuit 1. The logic states of $V_1$ and $V_2$ for an open circuit condition when switch SW is closed is shown in FIG. 3(2).

The indication of an open circuit condition by indicating means E and the interruption of the driving signal $V_{IN}$ for the load driving means are maintained until the latch circuit 14 is reset by operating holder releasing means F.

Thus, according to this embodiment, if switch SW, connected in series with battery 6, is closed prior to applying driving signal $V_{IN}$ to load driving means A, an open circuit condition of a load will be detected and the driving signal $V_{IN}$ will be prevented from being applied to load driving means A by action of AND circuit 1. If the indicating means E indicates the load is in an open circuit condition, a repair to the load can now be made.

Moreover, if driving signal $V_{IN}$ is applied to the load driving means A prior to the detection of an open circuit condition of the load 9, such as when an open circuit occurs during when load 9 is being driven normally, battery 6 still does not supply current to the open circuited load 9 and no damage can be incurred.

Short Circuit Load Condition

If the load is not in an open circuit condition when switch SW is closed, and a driving signal $V_{IN}$ is applied to the load driving means A, transistor 4 is made conductive by the high voltage applied to its base by driving signal $V_{IN}$, and a current flows through resistor $R_{5-1}$ and $R_{5-2}$. This causes transistor 7 to become conductive and causes an operating current to flow from battery 6 through transistor 7 and to load 9.

If load 9 subsequently exhibits a short circuit condition, the value of the voltage $V_2$ at the input terminal of the load will immediately become approximately zero volts. When this occurs, the voltage $V_1$ outputted by AND circuit 1 of load driving means A effectively gets pulled down to approximately 0.7 volts by the current flowing through the now forward biased diode 27 and load 9 short circuited to ground. Consequently, the voltage applied to the base of transistor 4 through diode D is now insufficient to turn on transistor 4. As a result, transistors 4 and 7 are caused to become instantaneously non-conductive, preventing high current from being applied to load 9 through transistor 7.

Accordingly, with voltage $V_1$ at 0.7 volts and voltage $V_2$ at effectively ground voltage, whose logic states are shown in FIG. 3(3), the output of AND circuit 24 becomes HIGH, and this HIGH state is latched by latch circuit 13. Transistor 17 of indicating means E is rendered conductive by this HIGH state of latch 13, and light emitting diode 19 is illuminated, thereby indicating that the load is in a short circuit condition.

At the same time, since the HIGH signal at the output terminal of latch circuit 13 is applied to one input of OR circuit 15, and the output of OR circuit 15 is inverted and applied to an input of AND circuit 1, further application of the driving signal $V_{IN}$ to the load driving means A is interrupted by AND circuit 1.

Thus, in this embodiment, when the load is in a short circuit condition, transistors and 4 and 7 are rendered nonconductive before AND circuit 1 is switched to discontinue the application of driving signal $V_{IN}$ to load driving means A. Thus, high current applied to the short circuited load is removed without the delay incurred by the various logic devices involved in switching the output of AND circuit 1. Thus, this high current is removed in far less time than in the device of FIGS. 5 and 6. Therefore, the damage to the load 9 and to other circuits by application of a high current to the short circuited load is prevented.

The illumination of light emitting diode 19 and the interruption of the driving signal $V_{IN}$ to the load driving means is maintained until latch circuit 13 is reset by operating holder releasing means F.

After repair of the load to eliminate the short circuit condition, latch circuit 13 may be reset by means of the holder releasing means F, and a current can again be supplied to the load 9 by applying the driving signal $V_{IN}$ to the load driving means A.

Normal Load Condition

Where the load exhibits a normal load condition, when switch SW is closed and a driving signal $V_{IN}$ is applied to the load driving means A, transistors 4 and 7 are rendered conductive and a current flows from battery 6 through transistor 7 and load 9 to ground. During this time, the logic value of the voltage $V_2$ at the input terminal of load 9 is HIGH, since transistor 7 is fully conductive. In this condition, as shown in FIG. 3(4), both the input voltage $V_1$ and the voltage $V_2$ at the input terminal of load 9 are HIGH, so that latch circuits 13 and 14 remain latched to a LOW state and light emitting diodes 19 and 20 of indicating means E are not illuminated.

In this normal load condition, the application of the driving signal $V_{IN}$ to load driving means A is not interrupted, and a current is supplied from the battery 6 to load 9 to drive load 9.

When switch SW is first closed without application of a driving signal $V_{IN}$ to the load driving means, the voltage $V_2$ will be a logical LOW if the load is in a normal condition or in a short circuited condition, since the value of $R_{5-3}$ is set higher than load resistance $R_L$ to bring about this logic state in both these load conditions. Since no driving signal $V_{IN}$ is being applied, voltage $V_1$ will also be LOW, as shown in FIG. 3(1), and latches 13 and 14 will remain in their LOW states.

Figure 4:
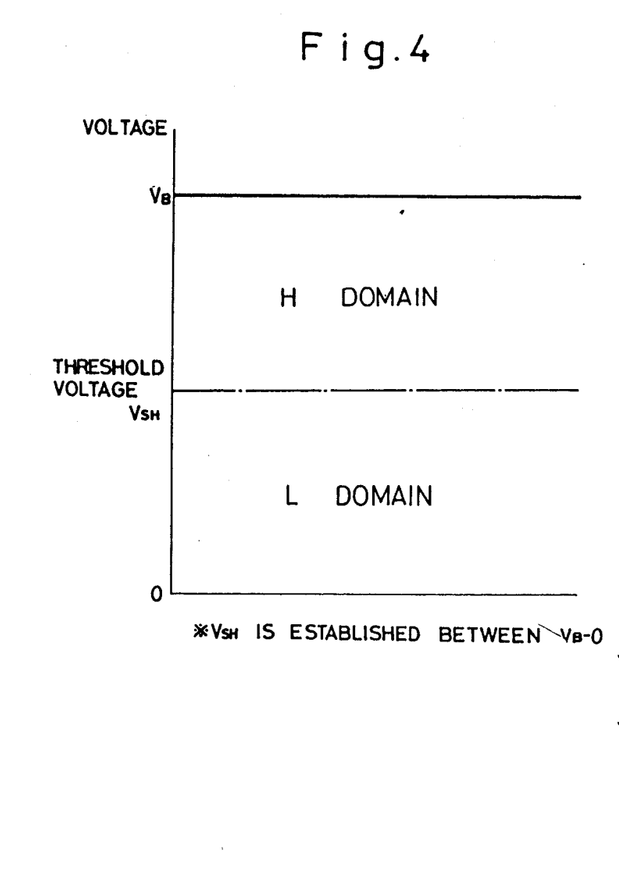

FIG. 4 shows arbitrary HIGH and LOW domains in which a voltage level may reside to bring about the above-described operation of the embodiment of FIG. 1. Since these domains may cover relatively wide ranges, the operation of the embodiment of FIG. 1 is stable over a relatively large variation of power supply voltage.

Thus, in the embodiment of the invention shown in FIGS. 1 and 2, the condition of the load 9 is determined from the various logic conditions shown in FIG. 3. Additionally, since the operation of transistors 4 and 7 are not significantly affected either by a voltage variation of battery 6 or by a relatively large permissible variation of the load condition, the condition determination of load 9 is executed stably and with high accuracy, so that the interruption of the input of driving signal $V_{IN}$ applied to load driving means A will only occur upon the load condition being abnormal. In addition, when the load is in a short circuit condition, since the power supply to the load is instantaneously cut off even before detection of the short circuit condition by the various logic means in the preferred embodiment, the damage to the load and any other circuits is prevented.

The foregoing description illustrates only a preferred embodiment of the present invention. Various modifications will become apparent to those skilled in the art without departing from the spirit and scope of the present invention which is only limited by the appended claims. Therefore, the embodiment shown and described is only illustrative, not restrictive.

What is claimed is:

1. A load condition detecting and driving system comprising:
   a switching means having a control terminal, a second terminal of said switching means being coupled to an input terminal of a load, said control terminal of said switching means being coupled to receive a driving signal for controlling said switching means to apply a driving current to said load; and
   coupling means coupled between said input terminal of said load and said control terminal of said switching means for rendering said switching means non-conductive when said load exhibits a short circuit condition, wherein as a voltage at said input terminal of said load becomes low due to said load exhibiting said short circuit condition, a voltage at said control terminal is instantaneously pulled down sufficiently to cause said switching means to be immediately rendered non conductive.

2. The system of claim 1 wherein said coupling means comprises a first diode.

3. The system of claim 2 wherein said switching means comprises a first transistor having a control terminal coupled to said control terminal of said switching means via a second diode, said second diode being to ensure said first transistor is non-conductive when said voltage at said control terminal of said switching means is pulled down by said input terminal of said load while exhibiting a short circuit condition.

4. The system of claim 2 further comprising a logic means coupled to said input terminal of said load and to said control terminal of said switching means for detecting a short circuit load condition or an open circuit load condition and preventing said driving signal from being applied to said control terminal of said switching means.

5. The system of claim 4 further comprising a current detecting element connected in parallel with said switching means for causing a logical high or logical low voltage level to appear at said input terminal of said load when said driving signal is not applied to said control terminal of said switching means, said logical high voltage level appearing when said load exhibits an open circuit condition and said logical low voltage level appearing when said load exhibits a short circuit condition or a normal operating condition.

6. The system of claim 5 further comprising an indicating means for visual indication of a short circuit load condition or an open circuit load condition.

* * * * *